(12) United States Patent
Inami

(10) Patent No.: US 8,173,449 B2
(45) Date of Patent: May 8, 2012

(54) METHOD FOR MAKING COP EVALUATION ON SINGLE-CRYSTAL SILICON WAFER

(75) Inventor: Shuichi Inami, Tokyo (JP)

(73) Assignee: Sumco Corporation, Tokyo (JP)

(*) Notice: Subject to any disclaimer, the term of this patent is extended or adjusted under 35 U.S.C. 154(b) by 354 days.

(21) Appl. No.: 12/308,060

(22) PCT Filed: May 22, 2007

(86) PCT No.: PCT/JP2007/060425
§ 371 (c)(1),
(2), (4) Date: Dec. 5, 2008

(87) PCT Pub. No.: WO2007/142024
PCT Pub. Date: Dec. 13, 2007

(65) Prior Publication Data
US 2009/0197358 A1    Aug. 6, 2009

(30) Foreign Application Priority Data
Jun. 9, 2006    (JP) ................................ 2006-161094

(51) Int. Cl.
*G01R 31/26* (2006.01)
*H01L 21/66* (2006.01)

(52) U.S. Cl. ......... 438/14; 257/48; 257/E21.53; 702/35; 702/36

(58) Field of Classification Search ...................... 702/36
See application file for complete search history.

(56) References Cited

U.S. PATENT DOCUMENTS
5,980,720 A    11/1999 Park et al.
6,507,800 B1    1/2003 Sheu
2004/0064269 A1    4/2004 Shibuya et al.
2004/0122624 A1*    6/2004 Naruoka ....................... 702/185
2007/0231932 A1    10/2007 Reynaud et al.

FOREIGN PATENT DOCUMENTS

| | | |
|---|---|---|
| DE | 100 48 432 A1 | 5/2001 |
| DE | 1 840 560 A2 | 10/2007 |
| JP | 11-106282 | 4/1999 |
| JP | 11-126736 A | 5/1999 |
| JP | 2001-308150 | 11/2001 |
| JP | 2001308150 A * | 11/2001 |
| JP | 2002-145698 | 5/2002 |
| JP | 2004-128391 | 4/2004 |
| JP | 2005-302199 | 10/2005 |
| KR | 10-2004-0031573 | 4/2004 |
| TW | 591129 B | 5/1999 |
| TW | 442880 | 6/2001 |
| TW | 445566 B | 7/2001 |
| TW | 516245 | 1/2003 |

* cited by examiner

*Primary Examiner* — Ha Tran T Nguyen
*Assistant Examiner* — Shaka Scarlett
(74) *Attorney, Agent, or Firm* — Clark & Brody

(57) ABSTRACT

An evaluation area of an evaluation object wafer is concentrically divided in a radial direction, an upper limit value to the number of COPs is set in each divided evaluation segment, and an acceptance determination of the single-crystal silicon wafer is made using the upper limit value as a criterion. Thereby, a quantitative and objective COP evaluation can be made, and a proper determination is made based on a clear criterion. The evaluation method of the present invention can sufficiently deal with automation of the COP evaluation (inspection) and the higher-quality wafer in the near future, and the evaluation method can be widely applied to production of the single-crystal silicon wafer and production of a semiconductor device.

7 Claims, 8 Drawing Sheets

[Criterion]

| | |
|---|---|
| R | Rejected product due to ring pattern |
| D | Rejected product due to disc pattern |
| R D | Rejected product due to ring-disc pattern |
| PATTERN | Total rejected products due to pattern generation (R+D+RD) |
| Gross | Rejected products due to pattern generation or the number of COPs of 100 or more |
| Crystal-induced | Crystal-induced COPs of rejected products |

[Criterion]

| Total | The number of COPs in whole surface of wafer is not less than 100 |
|---|---|
| <φ100 | The number of COPs in disc segment of ø100 is not less than 25 |
| φ100 ~280 | The number of COPs in ring segment of ø100 to ø280 is not less than 50 |
| New criterion 1 | Rejected products based on new criterion 1 |
| Crystal-induced | Crystal-induced COPs of rejected products |

FIG.6
(a)
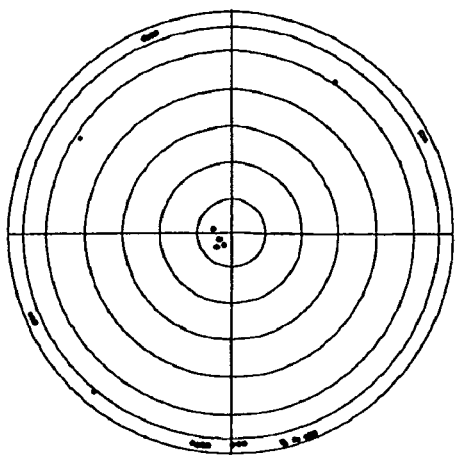
(b)
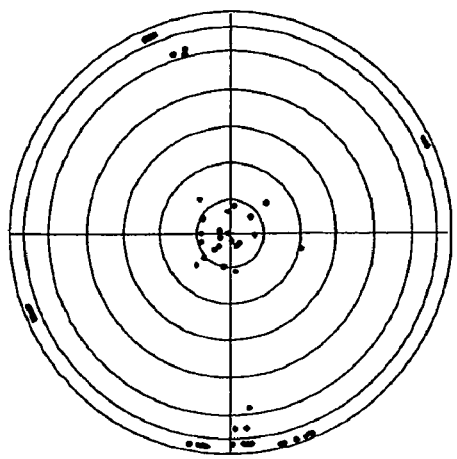
(c)
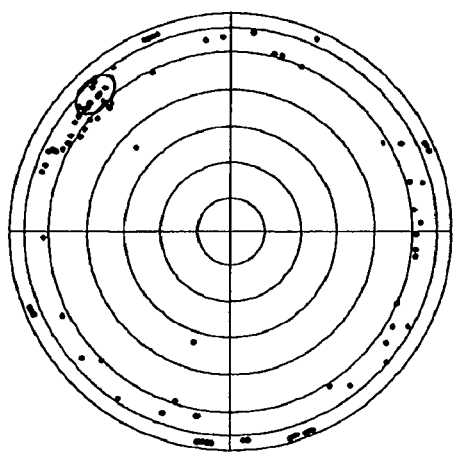

FIG.7

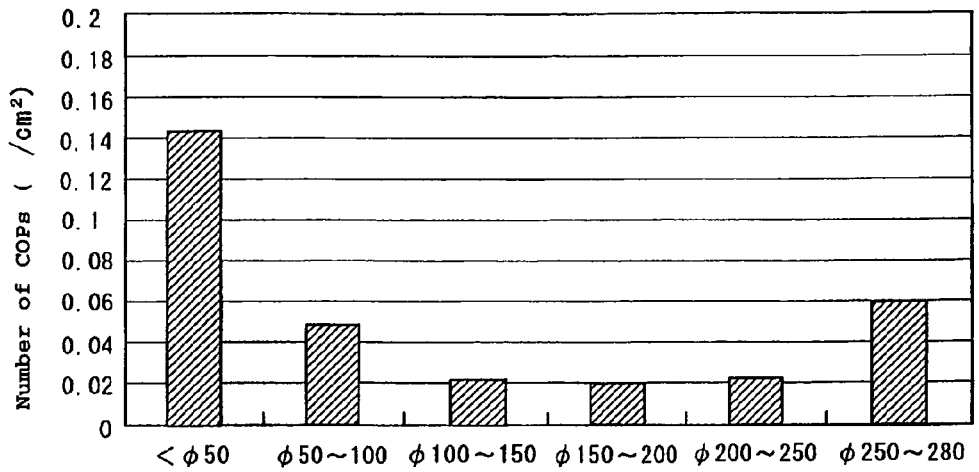

FIG.8

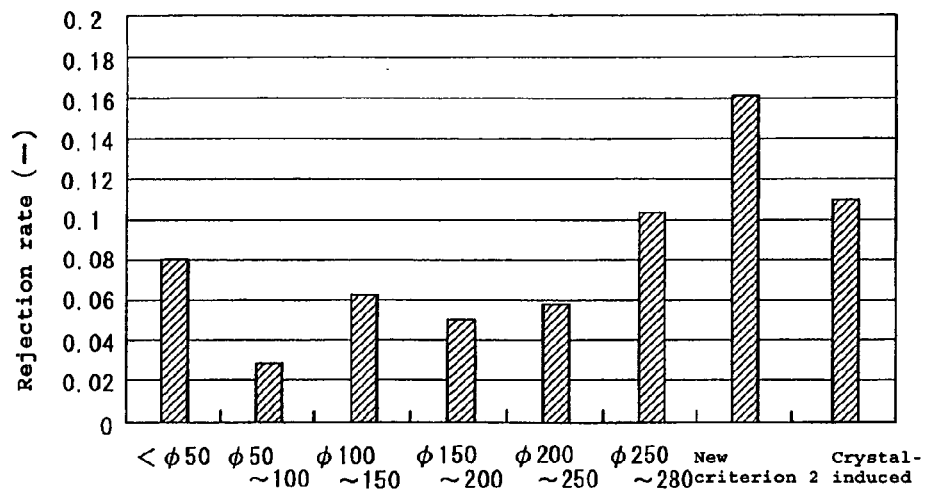

[Criterion]

| | |
|---|---|
| < φ50 | The number of COPs in disc segment of ø50 is not less than 7 |
| φ50 ~100 | The number of COPs in ring segment of ø50 to ø100 is not less than 18 |
| φ100 ~150 | The number of COPs in ring segment of ø100 to ø150 is not less than 9 |
| φ150 ~200 | The number of COPs in ring segment of ø150 to ø200 is not less than 13 |
| φ200 ~250 | The number of COPs in ring segment of ø200 to ø250 is not less than 16 |
| φ250 ~280 | The number of COPs in ring segment of ø250 to ø280 is not less than 12 |
| New criterion 2 | Rejected products based on new criterion 2 |
| Crystal-induced | Crystal-induced COPs of rejected products |

FIG.9

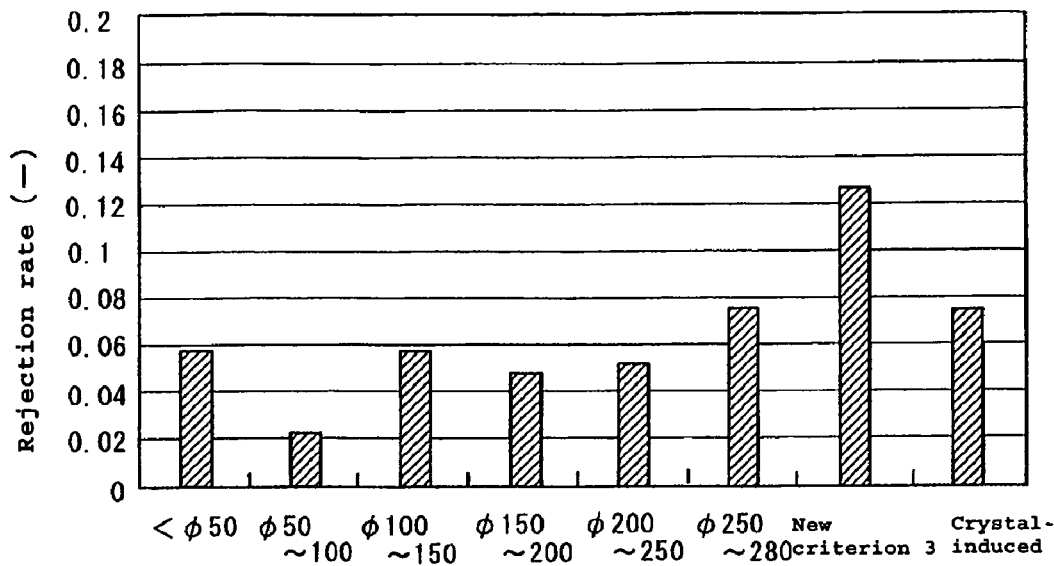

[Criterion]

| | |
|---|---|
| < φ50 | The number of COPs in disc segment of ø50 is not less than 10 |
| φ50 ~100 | The number of COPs in ring segment of ø50 to ø100 is not less than 23 |
| φ100 ~150 | The number of COPs in ring segment of ø100 to ø150 is not less than 13 |
| φ150 ~200 | The number of COPs in ring segment of ø150 to ø200 is not less than 17 |
| φ200 ~250 | The number of COPs in ring segment of ø200 to ø250 is not less than 21 |
| φ250 ~280 | The number of COPs in ring segment of ø250 to ø280 is not less than 16 |
| New criterion 3 | Rejected products based on new criterion 3 |
| Crystal-induced | Crystal-induced COPs of rejected products |

FIG.10
(a) 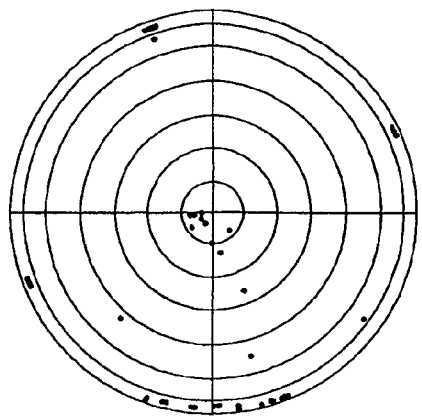  (b) 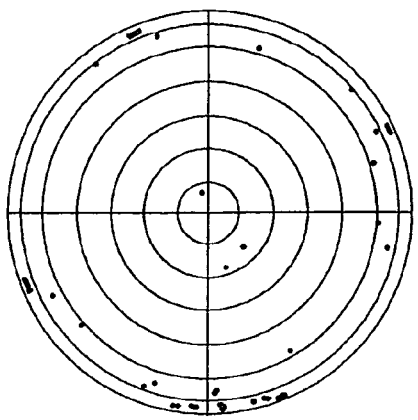
FIG.11
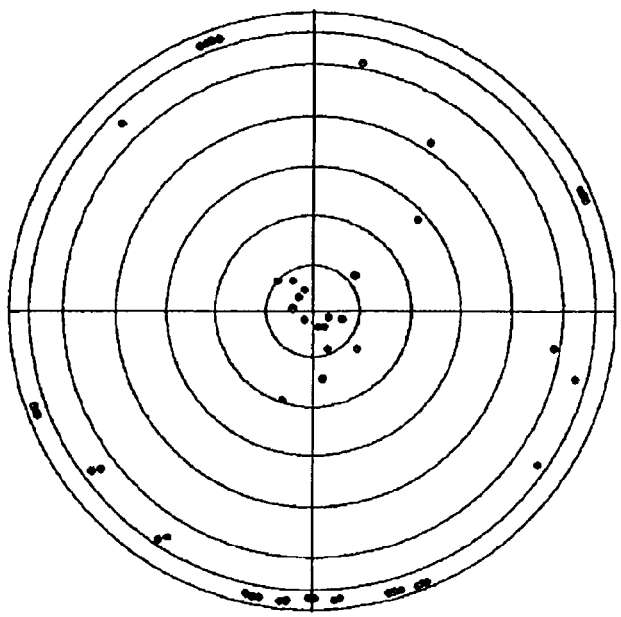

FIG.12

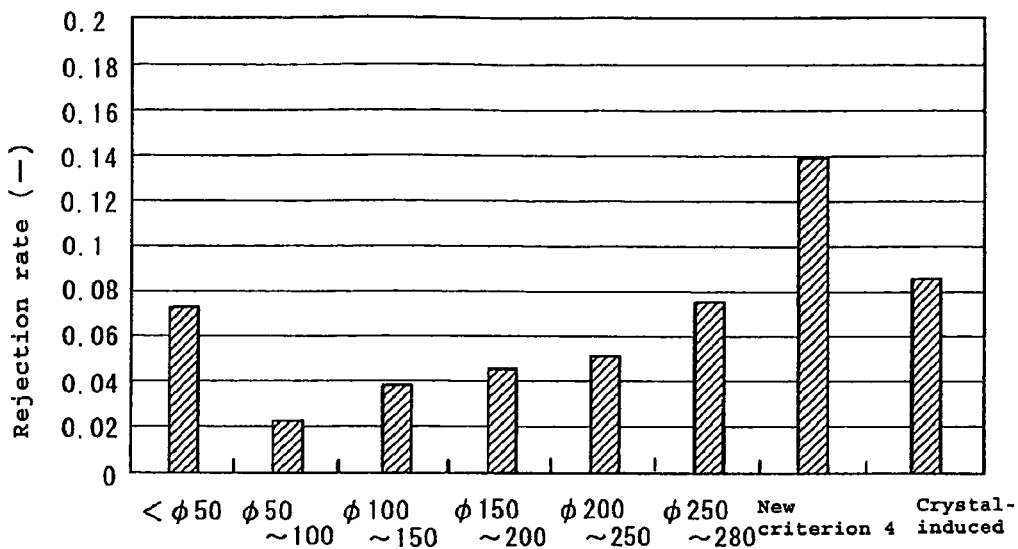

[Criterion]

| | |
|---|---|
| < φ50 | The number of COPs in disc segment of ø50 is not less than 10 |
| φ50 ~100 | The number of COPs in ring segment of ø50 to ø100 is not less than 23 |
| φ100 ~150 | The number of COPs in ring segment of ø100 to ø150 is not less than 13 |
| φ150 ~200 | The number of COPs in ring segment of ø150 to ø200 is not less than 17 |
| φ200 ~250 | The number of COPs in ring segment of ø200 to ø250 is not less than 21 |
| φ250 ~280 | The number of COPs in ring segment of ø250 to ø280 is not less than 16 |
| New criterion 4 | Rejected products based on new criterion 4 |
| Crystal-induced | Crystal-induced COPs of rejected products |

# METHOD FOR MAKING COP EVALUATION ON SINGLE-CRYSTAL SILICON WAFER

TECHNICAL FIELD

The present invention relates to a method for making a COP (Crystal Originated Particle) evaluation on a single-crystal silicon wafer, particularly a large-diameter silicon wafer of 300 mm.

BACKGROUND ART

A single-crystal silicon wafer as a semiconductor device substrate is cut out from a single-crystal silicon ingot, and is produced by being subjected to various physical, chemical, and heat treatments. The single-crystal silicon ingot is usually obtained by the Czochralski method (hereinafter referred to as "CZ method") in which a seed crystal is dipped in silicon melt in a quartz crucible and pulled up to grow a single crystal. However, micro defects called Grown-in defects are induced in the crystal during the single crystal growth.

The Grown-in defects depend on a pulling-up speed during the single crystal growth and a temperature distribution (temperature gradient in crystal in a pulling-up axis direction) in the single crystal immediately after solidification. In the single crystal, the Grown-in defect exists in the form of a hole aggregation defect called COP (Crystal Originated Particle), having a size ranging from about 0.1 to 0.2 µm, or in the form of a defect including a micro dislocation called a dislocation cluster, having a size of about 10 µm.

In the single-crystal silicon wafer produced by the CZ method, an Oxidation-induced Stacking Fault (hereinafter referred to as "OSF") appearing in a ring shape may be generated when the single-crystal silicon wafer is subjected to a high-temperature oxidation heat treatment. A potential area where the OSF ring is generated depends on a thermal history of the crystal during growth, particularly on an influence of a pulling-up speed during growth. The area where the OSF ring appears shrinks from the outer peripheral side to the inner side of the crystal as the pulling-up speed is lowered.

In other words, the inner side area of the OSF ring is spread to the whole wafer when the single crystal is grown at a higher speed, and the outside area of the OSF ring is spread to the whole wafer when the single crystal is grown at a lower speed.

In the case where OSF exists on a wafer surface which is of a device activation area, the OSF causes a leak current to deteriorate a device characteristic. A COP is a factor which lowers an initial oxide-film withstand voltage, and the dislocation cluster also causes a defective characteristic of the device formed therein.

Therefore, the single crystal is conventionally grown at a high pulling-up speed such that the ring-shaped OSF generation area is located in the outer peripheral portion of the crystal. For example, as described in Japanese Patent Application Publication No. 2002-145698, there is proposed a wafer in which growth and cooling conditions for an ingot near a single-crystal growth interface are adjusted to widely distribute the OSF area from a circumferential marginal portion to a central portion of the wafer and a micro COP area is formed inside the OSF area.

However, "a single-crystal silicon wafer in which the number of Grown-in defects including extremely small COPs is decreased as much as possible" (hereinafter referred to as a "defect-free crystal silicon wafer") is produced with the advance of the fine processing of the semiconductor device to cope with growing demand of recent miniaturization and high performance.

Accordingly, a COP evaluation is made in the defect-free crystal silicon wafer. In the COP evaluation, examples of the COP detection method include a method in which a surface defect inspection apparatus (for example, SP2: product of KLA-Tencor) is used and a method called a copper deposition method (copper decoration method).

That is, an acceptance determination in which crystal integrity (defect-free) is judged by the number of defects (COPs) and/or the presence or absence of a specific pattern through the COP evaluation is made, and it is determined that the wafer is rejected when the number of COPs exceeds a defined number in the whole surface of the wafer or when the pattern exists (is generated).

As used herein, the "COP" means the COP as a Grown-in defect induced into the crystal during the above single crystal growth (hereinafter referred to as "COP", and referred to as "crystal-induced COP" particularly when in need to distinguish from others). Other COPs arising from a factor such as micro flaw and scratch in handling the wafer (defects except the crystal-induced COP are referred to as "non-crystal-induced COP") are not an intrinsic defect derived from the single-crystal silicon itself, so that the non-crystal-induced COP is irrelevant and removed from the COP evaluation object.

The "pattern" is one of modes of the crystal-induced COP which is attributed to the facts that: a thermal history of the grown single-crystal silicon ingot is symmetric about the axis of pulling-up; and pulling-up speeds and Grown-in defect distribution have a particular relationship. Generally, the disc-shaped pattern (disc pattern) appears in a central portion of the wafer, the ring-shaped pattern (ring pattern) appears in an outer peripheral portion of the wafer, or both the disc pattern and the ring pattern co-existingly appear (ring and disc pattern). The pattern may not appear, whereas a specific mode with high density in the whole surface of the wafer emerges.

DISCLOSURE OF INVENTION

As described above, the COP evaluation is made in the defect-free crystal silicon wafer having an extremely small amount of Grown-in defects. However, only the number of COPs in the whole surface of the wafer is a quantitative determination measure. Since a determination whether or not the disc-shaped pattern or the ring-shaped pattern is generated is made by a visual inspection, the pattern determination lacks quantitative characterization and objectivity.

Additionally, in the COP evaluation for the silicon wafer of 300 mm in diameter, as described below, there is a problem that non-acceptance as being "COP pattern exists" is too much strict.

Although the criterion for the acceptance determination is required to become stricter with the advance of the device miniaturization, the production yield of the silicon wafer is directly lowered when the criterion is excessively tightened up. Therefore, it is necessary to cautiously make the COP evaluation in the silicon wafer.

In view of the foregoing, an object of the present invention is to provide an objective and quantitative method for making a COP evaluation on a single-crystal silicon wafer, in which the determination of the presence or absence of a specific pattern can be made for the single-crystal silicon wafer having an extremely small amount of Grown-in defects, particularly for the large-diameter single-crystal silicon wafer of 300 mm based on a clear criterion.

Here is the summary of the method for making a COP evaluation on a single-crystal silicon wafer according to the present invention.

The present invention provides a method for making a COP evaluation on a single-crystal silicon wafer, in which an evaluation division of the wafer is concentrically divided in a radial direction, an upper limit value to the number of COPs is set in each divided evaluation segment, and an acceptance determination is made using the upper limit value as a criterion.

As used herein, the "single-crystal silicon wafer" mainly means a silicon wafer having a diameter of 300 mm. That is, the evaluation method according to the present invention is mainly aimed at the large-diameter silicon wafer having the diameter of 300 mm or more.

The silicon wafer which is an object of the evaluation method is permitted as the wafer for high-integrated IC production, unless the COPs existing on the wafer surface form said pattern while being locally concentrated, or unless the number of COPs in the whole surface of the wafer is extremely large.

In the COP evaluation method (a first embodiment) according to the present invention, the silicon wafer becomes rejected when the number of COPs for segments of a central portion and an outer peripheral portion in the concentrically divided evaluation segments exceeds the upper limit value.

In the COP evaluation method (including the first embodiment), a width of each concentrically divided evaluation segment preferably ranges from 15 mm to 30 mm (second embodiment).

In the COP evaluation method (including a first and second embodiments), the number of COPs in a whole surface of the wafer can be not more than a predetermined upper limit value (a third embodiment).

The method for making a COP evaluation of a single-crystal silicon wafer according to the present invention is a quantitative evaluation method, in which the evaluation segment of the wafer is concentrically divided in a radial direction and the upper limit value to the number of COPs is set in each evaluation segment. For example, although a wafer having several COPs might be regarded as the disc pattern in the current determination method, the COP evaluation method of the present invention can determine that the pattern does not exists in the wafer (acceptance) based on the clear criterion.

The evaluation method of the present invention is based on the quantitative, clear criterion, so that the evaluation method can deal with the automation of the COP evaluation (inspection). The evaluation criterion such as the width of wafer divided segment and the upper limit value to the number of COPs in each segment can be flexibly reviewed in consideration of the COP generation state or the like, so that the evaluation method can sufficiently deal with the higher-quality wafer in the future.

BRIEF DESCRIPTION OF THE DRAWINGS

FIGS. 1(a) and 1(b) are views showing examples where non-crystal-induced COPs are generated in a wafer, in which FIG. 1(a) shows COPs extended in a curved line or dotted line and FIG. 1(b) shows COPs locally generated in a dot shape.

FIGS. 6(a), 6(b) and 6(c) are views showing a sample where relief based on the new criterion 1 is properly performed and samples where the relief is excessively performed, in which FIG. 6(a) shows an example where the relief is properly performed and FIGS. 6(b) and 6(c) show examples where the relief is excessively performed.

FIG. 7 is a chart showing COP density in each measurement segment of the whole sample.

FIG. 8 is a chart showing rejection rates based on a new criterion 2 while the rejection rates are divided in segments.

FIG. 9 is a chart showing rejection rates based on a new criterion 3 while the rejection rates are divided in segments.

FIGS. 10(a) and 10(b) are views showing samples which are accepted based on the current criterion while being rejected based on the new criterion 2, in which FIG. 10(a) shows an example where a disc pattern exists and FIG. 10(b) shows an example where a ring pattern exists.

FIG. 11 is a view showing a sample which is excessively relieved based on the new criterion 1 and also excessively relieved based on the new criterion 3.

FIG. 12 is a chart showing rejection rates based on a new criterion 4 while the rejection rates are divided in segments.

BEST MODES FOR CARRYING OUT THE INVENTION

Figure 1:
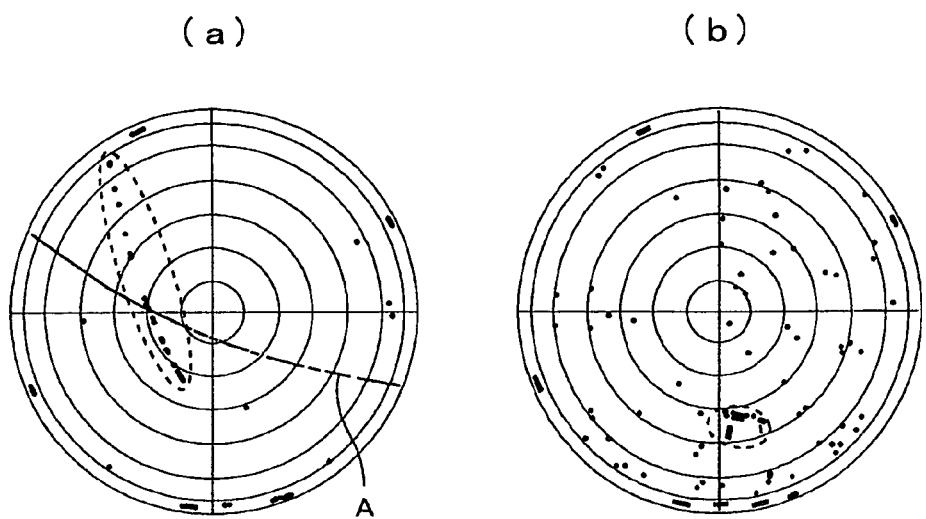

The method for making a COP evaluation of a single-crystal silicon wafer of the present invention is specifically described below. COP which is of the object of the present invention is processed by a copper deposition method using a Cu deposition apparatus described below, and then the counting of the number of COPs and distribution measurement are performed on the wafer surface by a visual inspection.

As described above, the method for making a COP evaluation of a single-crystal silicon wafer of the present invention is a method in which an evaluation segment of the wafer is concentrically divided in a radial direction, an upper limit value to the number of COPs is set in each divided evaluation segment, and an acceptance determination is made using the upper limit value as a criterion. That is, the acceptable determination is made when the number of COPs in each divided evaluation segment is not more than the upper limit value for all the segments, and the rejection as non-acceptable is made when the number of COPs in at least one of the divided evaluation segments exceeds the upper limit value.

The reason why the upper limit value to the number of COPs is set in each of the evaluation segments into which the wafer is concentrically divided in a radial direction is that determination is made based on the quantitative criterion to eliminate a fluctuation in determination results, which are generated due to different judges, as much as possible, thereby imparting objectivity to the determination results.

That is, in the conventional acceptance determination of the COP evaluation, when the disc-shaped pattern is generated in the central portion of the wafer, or when the ring-shaped pattern is generated in the outer peripheral portion of the wafer, the determination whether the disc-shaped pattern or the ring-shaped pattern is recognized as a specific pattern is made only by the visual inspection, and the quantitative determination is not made. However, in the evaluation method of the present invention, the quantitative determination can be made by setting the upper limit value to the number of COPs in each segment.

The reason why the evaluation segment is concentrically divided in a radial direction is that the thermal history of the grown single-crystal silicon ingot is symmetric about the axis of pulling-up to thereby symmetrically generate COPs with respect to the pulling-up axis.

There is no particular limitation to the specific numerical value for said upper limit value to be predetermined. As described later with a specific example, based on the actual achievement in the conventional COP evaluation, the upper limit value is defined in consideration of the COP generation state and the required quality and production yield of the wafer.

In the COP evaluation method of the present invention, the method of the second embodiment in which a width of each concentrically divided evaluation segment (that is, ring) is set in the range of 15 mm to 30 mm is desirably adopted.

The evaluation method is mainly aimed at the wafer having the diameter of 300 mm. Generally, the outermost peripheral ring-shaped segment having the width of 10 mm is removed from the evaluation object. Therefore, assuming that the wafer has the diameter of 300 mm, the segment to be evaluated ranges from the center of the wafer up to the radius of 140 mm. In the case where the segment to be evaluated be divided into ring shape segments each with the width of less than 15 mm, the number of segments is excessively increased, and the evaluation becomes cumbersome, thereby increasing cost.

When the width of the divided segment is more than 30 mm, the evaluation lacks density to lose the accuracy of evaluation. For the wafer having the diameter of 300 mm, the divided segment desirably has the width of about 25 mm. The widths of the divided evaluation segments are preferably equalized, but the present invention is not limited to it, and the divided evaluation segments may be appropriately defined based on the COP generation state or the like.

In the COP evaluation method of the present invention, the method of the first embodiment, in which the silicon wafer becomes rejected when the number of COPs for segments of a central portion and an outer peripheral portion among the concentrically divided evaluation segments exceeds the upper limit value, can be adopted. In other words, in this method, COPs existing in an intermediate portion in a radial direction of the wafer are regarded as the non-crystal-induced COPs.

This is because the crystal-induced COPs generally appear in a disc shape in the central portion of the wafer, in a ring shape in the outer peripheral portion of the wafer, or in a disc-ring shape simultaneously. The crystal-induced COPs may appear in high density in the whole surface of the wafer. In this case, the number of COPs should exceed the upper limit value, which is set in each evaluation segment, in plural (many) segments, so that the acceptance determination can be made. This method is an efficient evaluation method, since the COP evaluation is simply made based on the feature how the crystal-induced COPs exist (are generated).

In this case, the specific ranges of the central portion segment and outer peripheral portion segment are not particularly defined. The specific ranges may be appropriately defined based on the COP generation state or the actual evaluation data. However, for the wafer having the diameter of 300 mm, given that $\phi$ is a concentric diameter having the same center as the wafer, reliability of the evaluation is desirably enhanced when, generally, the central portion segment is a circle (disc) having the diameter in the range of 50 mm>$\phi$>30 mm while the outer peripheral portion segment is a segment (ring) sandwiched between circles having the diameters of $\phi$=260 mm and $\phi$=290 mm.

In this COP evaluation method, the method of the third embodiment in which the number of COPs in a whole surface of the wafer is not more than a predetermined upper limit value can be adopted.

In the method of a third embodiment, the upper limit to the number of COPs is defined in addition to the pattern determination whether or not the pattern exists. In this case, the total amount of the upper limit values to the number of COPs in the divided evaluation segments may be the same as the upper limit value to the number of COPs in the whole surface of the wafer. Alternatively, the total amount of the upper limit values to the number of COPs in the evaluation segments is set smaller, and the upper limit value to the number of COPs in the whole surface of the wafer may be set, as described above, being independent of such total amount.

In the above COP evaluation method of the present invention, the acceptance determination is made but for the COPs that are regarded to arise from the factor other than the defects that are induced during the crystal growth (that is, non-crystal-induced). This is also made in the conventional COP evaluation. The non-crystal-induced COPs, because they are not intrinsic wafer defects, differ from the crystal-induced COPs.

FIGS. 1(a) and 1(b) are views schematically showing examples where the non-crystal-induced COPs are generated in the wafer, in which FIG. 1(a) shows COPs extended in a curved line (designated by the reference numeral A) and COPs extended in a dotted line (portion surrounded by a broken-line ellipse), and FIG. 1(b) shows COPs locally generated in a dot shape (portion surrounded by a broken-line ellipse).

FIGS. 1(a) and 1(b) depict (sketch) copper deposited by the copper deposition method which is usually used as the COP detection method, based on an image captured by an image scanner (wafer macroscopic inspection image input device). In FIGS. 1(a) and 1(b), black dots indicate positions at which COPs exist. Concentric circles on the image mean auxiliary lines which are used for the segment division of the present invention. Orthogonal lines are auxiliary lines used to divide the image into four quadrants, a first quadrant to a fourth quadrant (the same holds true for FIGS. 2, 4, 6, 10 and 11).

The above copper deposition process was performed based on steps (i) to (iii). The Cu deposition apparatus includes an upper plate (electrode plate) and a lower plate (electrode plate) which are disposed with a predetermined interval. A space surrounded by both the plates and side wall portions is filled with an electrolyte solution (a methanol solution in which $Cu^{2+}$ is eluted), the wafer is attached onto the lower plate, and a voltage is applied between both the plates (electrode plates).

(i) The wafer is washed to remove external contamination sources such as particles.

(ii) Thermal oxidation is performed to form an insulating film having a predetermined thickness (oxide film; thickness is set to 50 nm in this case) on the wafer surface. In order to ensure electric contact between a lower portion (backside) of the wafer and the lower plate (electrode plate), part of the insulating film in the lower portion of the wafer is taken off by etching.

(iii) The Cu deposition process is performed. Using the Cu deposition apparatus, a first voltage is applied such that the upper plate (electrode plate) has a negative potential with respect to the lower plate (electrode plate) (in this case, the voltage of 50 V is applied to the insulating film having the thickness of 50 nm), and a second voltage is applied such that the upper plate (electrode plate) has a positive potential with respect to the lower plate (electrode plate) (in this case, the voltage of 25 V is applied to the insulating film having the thickness of 50 nm).

The voltage application method used in Step (iii) was proposed for a wafer inspection method in Japanese Patent Application No. 2005-302199 filed by the present inventor. The voltage application is separated into the first and the second voltage application steps, and it is thereby confirmed that the single-crystal silicon wafer having an extremely small amount of Grown-in defects can be also inspected with high accuracy.

After the process performed by the copper deposition method, the counting of the number of COPs on the wafer surface and the COP evaluation determination (distinction between the crystal-induced and the non-crystal-induced) are made by the visual inspection.

FIG. 1(a) shows an example of COPs which is regarded as COPs arising from scratch defects. FIG. 1(b) shows an example of COPs which is locally generated in a dot shape, and it can be judged that the defects exist in relevant spots. These two examples are COPs that are easily determined to be non-crystal-induced.

Figure 2:
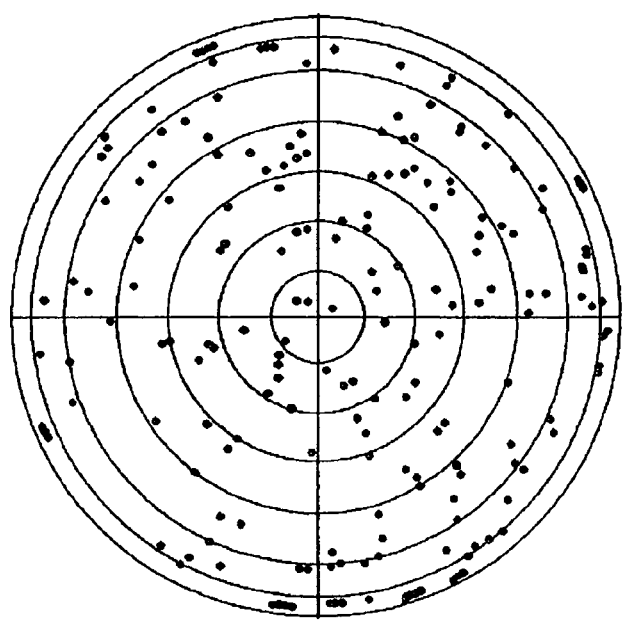
FIG. 2 is a view showing another example where the non-crystal-induced COPs are generated in the wafer.

FIG. 2 is a view showing another example where the non-crystal-induced COPs are generated in the wafer. Unlike the examples of FIGS. 1(a) and 1(b), COPs as extending in the curved line or dotted line or COPs as being locally generated in the dot shape are not observed on the wafer surface, and COPs are generated in the whole surface of the wafer without giving a particular characteristic. Therefore, it is hardly determined that the example of FIG. 2 is non-crystal-induced.

Thus, some determinations are easily made whether or not COPs are non-crystal-induced and others are hardly made. In applying the COP evaluation method of the present invention, the acceptance determination is made while the non-crystal-induced COPs are removed as much as possible.

An application example of the COP evaluation method of the present invention is described below. In counting the number of COPs, the COPs that can be easily regarded as the non-crystal-induced COPs as shown in FIGS. 1(a) and 1(b) are removed, and the COPs of FIG. 2 are regarded as defects (COPs) since the judgment thereof is difficult although possibility of being non-crystal-induced is high.

[New Criterion 1] Consideration

The acceptance determination was made with a coarse segment setting in order to understand the whole picture. The evaluation area was divided into the disc segment having the diameter of 100 mm or less and the ring segment having the diameter of 100 to 280 mm. The upper limit value to the number of COPs was set at 25 for the disc segment having the diameter of 100 mm or less, and the upper limit value to the number of COPs was set at 50 for the ring segment having the diameter of 100 to 280 mm.

Table 1 shows area segmentation and the upper limit value to the number of COPs.

TABLE 1

| Area segmentation | | <φ100 | φ100-280 |
|---|---|---|---|
| Upper limit value to the number of COPs | Set value | 25 | 50 |
| | Total number | 75 | |

In Table 1, "<φ100" means a disc-shaped segment having the diameter less than 100 mm, and "φ100-280" means a ring-shaped segment having a ring space between the diameters of 100 mm and 280 mm. The same holds true for Tables 2 to 4.

[New Criterion 2]

Since the area segmentation of the new criterion 1 is coarse in an R direction, it was found that the new criterion 1 may not be applicable to the case where COPs are locally generated. For example, in the segment having the diameter less than 100 mm, the disc pattern may be formed even if the number of COPs is not more than 25. In such a case, it is not possible to reject it as non-acceptable based on the new criterion 1.

Then, the area segmentation is finely incorporated and the upper limit value to the number of COPs is set in each segment. The method for computing the upper limit value to the number of COPs was identical to the method of the new criterion 1. However, in round-off computation, the total amount of the upper limit values to the number of COPs in the segments having the diameter less than 100 mm was set at 25 so as to be identical to the case of the new criterion 1, and the total amount of the upper limit values to the number of COPs in the segments having the diameter of 100 mm to 280 mm was set at 50 so as to be identical to the case of the new criterion 1.

Table 2 shows the area segmentation and the upper limit value to the number of COPs. The upper limit value to the number of COPs was 75 in the whole surface of the wafer.

TABLE 2

| | | Area segmentation | | | | | |
|---|---|---|---|---|---|---|---|
| | | <φ100 | | φ100-280 | | | |
| | | <φ50 | φ50-100 | φ100-150 | φ150-200 | φ200-250 | φ250-280 |
| Upper limit value to the number of COPs | Set value | 7 | 18 | 9 | 13 | 16 | 12 |
| | Total amount | | | 75 | | | |

[New Criterion 3]

In the new criteria 1 and 2, the upper limit value to the number of COPs is 75 in the whole surface of the wafer. In order to relieve the determination criterion, the upper limit value to the number of COPs is adjusted to 100 as a new criterion 3. At this point, the upper limit value to the number of COPs is adjusted so as to become 100 in the whole surface of the wafer while the ratio of the numbers of COPs among the segments in the new criterion 2 is kept constant.

Table 3 shows the area segmentation and the upper limit value to the number of COPs.

TABLE 3

| | | Area segmentation | | | | | |
|---|---|---|---|---|---|---|---|
| | | <φ100 | | φ100-280 | | | |
| | | <φ50 | φ50-100 | φ100-150 | φ150-200 | φ200-250 | φ250-280 |
| Upper limit value to the number of COPs | Set value | 10 | 23 | 13 | 17 | 21 | 16 |
| | Total amount | | | 100 | | | |

[New Criterion 4]

The acceptance determination state based on the new criteria 1, 2 and 3 was studied, and the upper limit value to the number of COPs was adjusted such that the acceptable determination was not made for the wafer in which the patter appears, and such that the rejection as non-acceptable was not made for the wafer in which the patter does not appear. As a result, the obtained criterion is set to a new criterion 4.

Table 4 shows the area segmentation and the upper limit value to the number of COPs.

TABLE 4

|  |  | Area segmentation | | | | | |
|---|---|---|---|---|---|---|---|
|  |  | <φ100 | | φ100-280 | | | |
|  |  | <φ50 | φ50-100 | φ100-150 | φ150-200 | φ200-250 | φ250-280 |
| Upper limit value to the | Set value | 8 | 21 | 13 | 17 | 21 | 20 |
| number of COPs | Total amount | 100 | | | | | |

The COP evaluation was made for the defect-free crystal silicon wafer (n=173) based on the determination criteria comprising a new criterion 1 to a new criterion 4, and the adequacy of the determination criteria was studied. The evaluation was simultaneously made for the wafer having the diameter of 300 mm based on the current criterion (that is, the rejection as non-acceptable is made when the number of COPs exceeds 100 in the whole surface of the wafer, or when the determination that the pattern exists is made by the visual examination).

Figure 3:
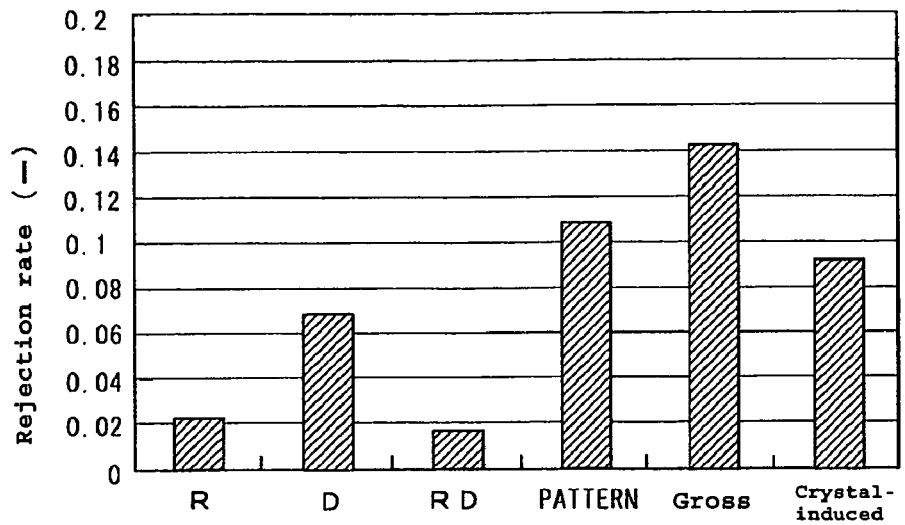
FIG. 3 is a chart showing a result of COP evaluation for a defect-free crystal silicon wafer.

Determination Based on Current Criterion:

FIG. 3 is a chart showing a result of the COP evaluation based on the current criterion. In FIG. 3, rejection rates are ratios of rejected products to the total number of wafers used in the evaluation. The same holds true for FIGS. 5, 8, 9 and 12 described below.

In FIG. 3, "R", "D" and "RD" in a horizontal axis indicate rejected product rates due to the existence of the ring pattern, disc pattern, and ring and disc pattern, respectively. "R", "D" and "RD" do not overlap one another. Accordingly, "PATTERN", which is the sum of these three patterns, is the rejected product rate due to the existence of any pattern. "Gross" is a rejection rate including "PATTERN" and the rejected products in which the number of COPs exceeds 100 in the whole surface of the wafer.

"Crystal-induced" is a rejection rate of only the crystal-induced COPs, in which the COPs that had been broadly counted as being crystal-induced because of difficulty in determining whether non-crystal-induced or not are rigorously removed since the COPs are judged as being non-crystal-induced based on "determination method of COP generation factor" devised by the present inventor. The same holds true for FIGS. 5, 8, 9 and 12 described below.

Figure 4:
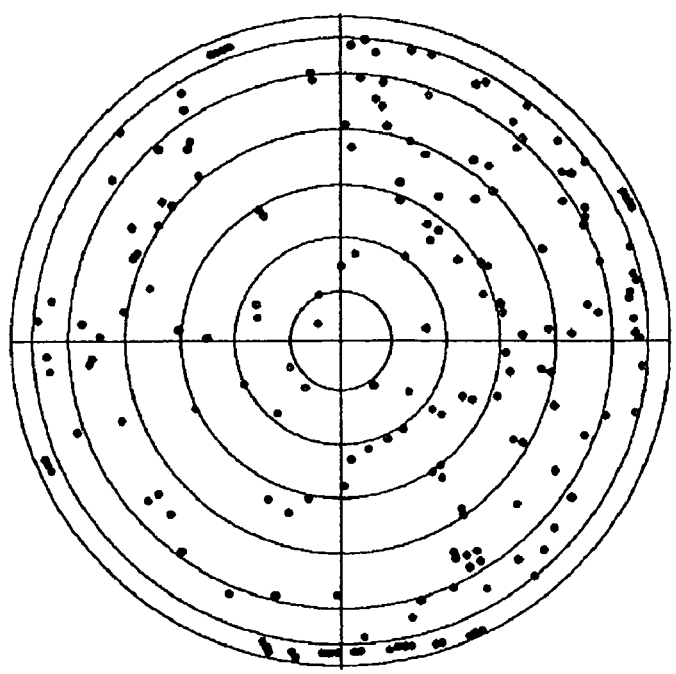
FIG. 4 is a view showing an example where a rejection as non-acceptable is made based on a current determination criterion irrespective of the non-crystal-induced COPs.

FIG. 4 is a view showing an example where the rejection as non-acceptable is made based on the current determination criterion irrespective of the non-crystal-induced COPs. In the wafer (sample) of FIG. 4, the ring pattern and the disc pattern are not generated, but the non-crystal-induced COPs are generated in the dot shape and the number of COPs exceeds 100 in the whole surface of the wafer. Therefore, the wafer (sample) of FIG. 4 is rejected.

Figure 5:
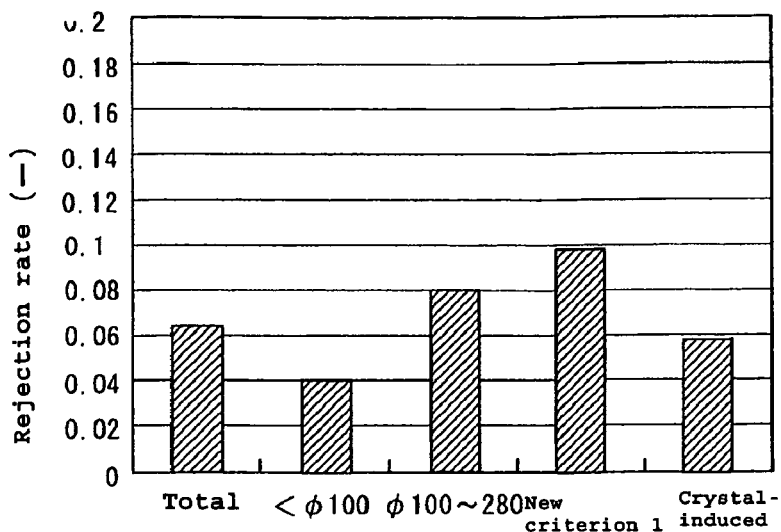
FIG. 5 is a chart showing a determination result based on a new criterion 1.

Determination Based on New Criterion 1:

FIG. 5 is a chart showing a determination result based on the new criterion 1.

In FIG. 5, "Total" of the horizontal axis indicates a ratio of the rejected products in which the number of COPs exceeds 100 in the whole surface of the wafer. "<φ100" and "φ100-φ280" indicate the rejected products based on the criterion shown in Table 1, and the rejection rate in each segment includes the overlapping rejected products. "New criterion 1" indicates the total amount (excluding the overlapping rejected products) of the rejected products based on the new criterion 1.

In the new criterion 1, the rejection rate is decreased by 0.046 compared with the rejection rate (FIG. 3) based on the current criterion. The decrease of the rejection rate is attributable to the samples relieved from those rejected under the current criterion (that is, the acceptable samples based on the new criterion 1 of the rejected samples based on the current criterion).

Table 5 collectively shows the number of properly relieved samples and the number of excessively relieved samples (that is, the sample which should not be relieved) in each pattern.

TABLE 5

|  | Disc pattern | | Ring pattern | |
|---|---|---|---|---|
|  | Proper relief | Excessive relief | Proper relief | Excessive relief |
| The number of samples relieved based on new criterion 1 | 4 | 5 | 0 | 1 |

As shown in Table 5, in both the disc-shaped and ring-shaped patterns, the sum of the relieved samples is 10 while the excessively relieved samples are 6. It is found that when the determination is made while the new criterion 1 is applied to the samples which become rejected due to the pattern generation by the current criterion, approximately a half of the rejected products is excessively relieved.

FIGS. 6(a), 6(b) and 6(c) are views showing a sample where the relief based on the new criterion 1 is properly performed and samples where the relief is excessively performed, in which FIG. 6(a) shows an example where the relief is properly performed and FIGS. 6(b) and 6(c) show examples where the relief is excessively performed.

The sample of FIG. 6(a) is properly relieved based on the new criterion 1 although the rejection as non-acceptable is made due to the disc pattern generation based on the current criterion. The sample of FIG. 6(b) is the acceptable sample which is regarded as the non-crystal-induced COPs (in this case, locally generated COPs caused by the processing) based on the new criterion 1 irrespective of the appearance of the disc pattern.

The sample of FIG. 6(c) is an example which is regarded as the non-crystal-induced (processing-induced) COPs in an area surrounded by a bold solid-line ellipse based on the new criterion 1 although the determination of the ring pattern is made based on the current criterion. In this sample, some COPs other than those surrounded by the ellipse are strongly suspected to be derived from the processing, and the crystal-induced COPs and the non-crystal-induced COPs are hardly distinguished from each other.

Determination Based on New Criterion 2 and New Criterion 3:

As described above, it is found that the sample which should be rejected due to the disc pattern and the ring pattern becomes inadvertently acceptable in the determination based on the new criterion 1. Therefore, a method for improving the accuracy of acceptance determination was studied.

FIG. 7 is a chart showing COP density in each measurement segment of the whole sample.

As can be seen from FIG. 7, the COP density is particularly high in the segment of "<φ50" and the segment of "φ250-φ280". This reflects that many COPs generated as the disc pattern and the ring pattern are distributed in these segments.

Accordingly, in order to catch the pattern of FIG. 7, it is necessary that the evaluation area be divided into segments finer than those of the new criterion 1 to evaluate the number of COPs.

Therefore, the evaluation area was divided into the ring segments each having a width of 25 mm, and the number of COPs for acceptance was set in each ring segment to make the evaluation. Table 2 and Table 3 show the new criterion 2 and the new criterion 3, respectively. In the new criterion 2, the determination criterion of the new criterion 1 is allocated to the divided segments. In the new criterion 3, the number of COPs (total number of COPs) is increased from 75 to 100 in the whole surface of the wafer while the proportion of the number of COPs among the segments in the new criterion 2 is kept constant.

FIGS. 8 and 9 are charts showing the rejection rates based on the new criteria while the rejection rates are given to divided segments, FIG. 8 shows the rejection rate based on the new criterion 2, and FIG. 9 shows the rejection rate based on the new criterion 3. In FIGS. 8 and 9, the rejection rate in each of the segments "<φ50" to "φ250-φ280" of the horizontal axis indicates a ratio of the rejected products based on the criterion shown in Table 2 or 3, and the rejection rate in each evaluation segment includes the overlapping rejected products. "New criterion 2" or "New criterion 3" in a horizontal axis is the total amount of the rejected products (excluding the overlapping rejected products) based on the new criterion 2 or the new criterion 3, respectively.

In the feature of the determination results based on the new criterion 1 to new criterion 3, the gross rejection rates become 0.0982, 0.1619 and 0.1272 in the order of the new criteria 1, 2 and 3, and the determination results based on the new criteria 2 and 3 is higher than the determination results based on the new criterion 1 in the rejection rate. The difference is attributed to the fact that the new criterion 1 has the low rejection rate since the acceptable determination is made for the samples of "pattern exists" which should be rejected, while the rejection as non-acceptable is made for the samples of "pattern exists" which should be rejected in the new criteria 2 and 3.

In the detailed study of the acceptance determination based on the new criterion 2, the rejection as non-acceptable is made for only one sample of the samples properly relieved (acceptable) based on the new criterion 1. This is because this sample is determined that the disc pattern exists. All the samples excessively relieved (that is, the samples which should not be relieved) based on the new criterion 1 become rejected in the new criterion 2, the effect of the determination criterion improvement is obtained.

However, in the new criterion 2, the rejection as non-acceptable (disc pattern exists) was made for one sample and the rejection as non-acceptable (ring pattern exists) was made for four samples, in which the pattern did not exist (that is, acceptable) based on the current determination criterion (pattern determination was made by visual inspection).

FIGS. 10(a) and 10(b) are views showing samples which are accepted based on the current criterion while being rejected based on the new criterion 2, in which FIG. 10(a) shows an example where the disc pattern exists and FIG. 10(b) shows an example where the ring pattern exists.

Since the pattern is not recognized in the visual determination, it is necessary that the number of COPs which is of a standard reference in the new criterion 2 be reviewed in order that the samples properly become acceptable according to the actual condition.

The acceptance determination based on the new criterion 3 is studied in detail.

Only one sample which is excessively relieved based on the new criterion 1 is also excessively relieved based on the new criterion 3. In the new criterion 3, unlike the new criterion 2, the sample which is acceptable based on the current criterion does not become rejected.

FIG. 11 is a view showing a sample which is excessively relieved based on the new criterion 1 and also excessively relieved based on the new criterion 3.

In the case of the sample which becomes rejected based on the new criterion 2 since the disc pattern exists, the upper limit value to the number of COPs is 7 in the segment of "<φ50". In the example in which the rejected samples due to the disc pattern (samples which should not be acceptable) are excessively relieved based on the new criterion 3, the upper limit value to the number of COPs is 10 in the same segment of "<φ50". The difference in acceptance or rejection is the number of COPs of 3. Thus, since the setting of the number of COPs in the segment of "<φ50" which becomes the disc determination criterion has a delicate influence on the determination of the presence or absence of the disc pattern, it is necessary that the COP generation state be sufficiently studied to perform the setting according to the actual state.

Determination Based on New Criterion 4:

The new criterion 4 was set based on the study on the determination results of the new criteria 1, 2 and 3. In the new criterion 4, compared with the new criterion 3, the upper limit value to the number of COPs was decreased from 10 to 8 in the segment of "<φ50", and the upper limit value to the number of COPs was increased from 16 to 20 in the segment of "φ250-φ280". In order that the number of COPs was set at 100 in the whole surface of the wafer, the number of COPs was decreased from 23 to 21 in the segment of "φ50-φ100".

FIG. 12 is a chart showing rejection rates based on the new criterion 4 while the rejection rates are divided in segments.

The new criterion 4 had the rejection rate of 0.1387. In the COP evaluation based on the new criterion 4, the trouble was not generated in the pattern determination unlike the evaluations based on the new criteria 1, 2 and 3.

Thus, the application examples of the COP evaluation method of the present invention are described hereinabove. The new criteria 1 to 4 are the COP determination criteria in which the width of the evaluation segment, the upper limit value in each evaluation segment and the like are specifically defined based on the requirements in the COP evaluation method of the present invention. In this case, the new criterion 4 was the optimum evaluation criterion.

Thus, in applying the COP evaluation method of the present invention, it is necessary that the semi-empirical technique of utilizing the past actual performance of the evaluation (inspection) be adapted in consideration of the COP generation (existence) state in the produced wafer, the required quality level and the like, and that the specific criterion be defined for the divided width of the evaluation segment of the wafer, the upper limit value to the number of COPs in each evaluation segment and the like.

The acceptance determination is made based on the specific criterion in applying the COP evaluation method of the present invention, so that the objective evaluation can be made based on the clearly (quantitative) criterion irrespective of the subjectivity of the inspector. Therefore, the COP evaluation method of the present invention can sufficiently correspond to the automation of the COP evaluation (inspection).

Additionally, the semi-empirical technique is adapted to flexibly review the evaluation criterion for the divided width of the evaluation segment, the upper limit value to the number of COPs and the like, so that the COP evaluation method of the present invention can sufficiently correspond to the higher-quality wafer in the future.

INDUSTRIAL APPLICABILITY

In the method for making a COP evaluation of a single-crystal silicon wafer, the quantitative and objective evaluation can be made, and the proper determination is made based on the clear criterion. The evaluation method of the present invention can sufficiently meet automation of the COP evaluation (inspection) and the higher-quality wafer in the near future, and the evaluation method can be widely applied to production of the single-crystal silicon wafer and production of a semiconductor device.

The invention claimed is:

1. A method for making a crystal originated particle evaluation on a single-crystal silicon wafer, comprising:
    concentrically dividing an evaluation area of the wafer in a radial direction;
    setting an upper limit value to the number of crystal originated particles in each divided evaluation segment; and
    making an acceptance determination using the upper limit value as a criterion;
    wherein the evaluation is performed for crystal originated particles induced into the crystal during single crystal growth, and crystal originated particles which are considered not to be included in a pattern of crystal originated particles induced into the crystal during the single crystal growth are excluded.

2. The method for making a crystal originated particle evaluation on a single-crystal silicon wafer according to claim 1, wherein the silicon wafer becomes rejected when the number of crystal originated particles for segments of a central portion and an outer peripheral portion in the concentrically divided evaluation segments exceeds the upper limit value.

3. The method for making a crystal originated particle evaluation on a single-crystal silicon wafer according to claim 1, wherein a width of each concentrically divided evaluation segment ranges from 15 mm to 30 mm.

4. The method for making a crystal originated particle evaluation on a single-crystal silicon wafer according to claim 1, wherein the number of crystal originated particles in a whole surface of the wafer is not more than a predetermined upper limit value.

5. The method for making a crystal originated particle evaluation on a single-crystal silicon wafer according to claim 2, wherein a width of each concentrically divided evaluation segment ranges from 15 mm to 30 mm.

6. The method for making a crystal originated particle evaluation on a single-crystal silicon wafer according to claim 2, wherein the number of crystal originated particles in a whole surface of the wafer is not more than a predetermined upper limit value.

7. The method for making a crystal originated particle evaluation on a single-crystal silicon wafer according to claim 3, wherein the number of crystal originated particles in a whole surface of the wafer is not more than a predetermined upper limit value.

* * * * *